(12) United States Patent
Kim et al.

(10) Patent No.: US 6,246,074 B1
(45) Date of Patent: Jun. 12, 2001

(54) THIN FILM TRANSISTOR SUBSTRATE WITH TESTING CIRCUIT

(75) Inventors: Jeom Jae Kim, Seoul; Seog Sang Hyun; Chi Hun Hahm, both of Kumi; Ki Tae Kim, Daeku, all of (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/408,850

(22) Filed: Sep. 30, 1999

(30) Foreign Application Priority Data

Sep. 30, 1998 (KR) .................................................. 98-41209
Nov. 13, 1998 (KR) .................................................. 98-48785

(51) Int. Cl.⁷ .......................... H01L 23/58; H01L 29/04; H01L 31/20; H01L 31/036; H01L 31/0376
(52) U.S. Cl. ................................ 257/48; 257/59; 257/72; 257/350
(58) Field of Search ........................... 257/59, 72, 350, 257/48; 349/139, 140, 149, 152

(56) References Cited

U.S. PATENT DOCUMENTS

| | | | |
|---|---|---|---|
| 5,068,748 | * 11/1991 | Ukai et al. | 359/59 |
| 5,497,146 | * 3/1996 | Hebiguchi | 340/825.91 |
| 5,668,032 | 9/1997 | Holmberg et al. | 438/144 |
| 5,909,035 | 6/1999 | Kim | 257/59 |
| 5,936,687 | 8/1999 | Lee | 349/40 |

FOREIGN PATENT DOCUMENTS

WO 9831050    7/1998 (WO) .

* cited by examiner

*Primary Examiner*—Ngân V. Ngô
(74) *Attorney, Agent, or Firm*—Long Aldridge & Norman LLP

(57) ABSTRACT

A thin film transistor (TFT) matrix substrate has a testing circuit that can accurately detect the breaks in gate lines and data lines. In a substrate, TFTs are provided to be connected at the intersections of the gate lines and the data lines. A first shorting bar is commonly connected to the gate lines and a second shorting bar is commonly connected to the data lines. A first test pad receives a first test signal to be applied to the first shorting bar and a second test pad receives a first test signal to be applied to the second shorting bar. A third shorting bar is commonly connected to static electricity preventing devices installed at the gate lines and a fourth shorting bar is commonly connected to static electricity preventing devices installed at the data lines. A third test pad allows the second test signal to be applied to the third and fourth shorting during driving testing if the gate lines and the data lines have breaks or damaged.

23 Claims, 7 Drawing Sheets

THIN FILM TRANSISTOR SUBSTRATE WITH TESTING CIRCUIT

This application claims the benefit of Korean Patent Application Nos. P98-41209 and P98-48785, filed on Sep. 30 and Nov. 13, 1998, which is hereby incorporated by reference.

BACKGROUND OF THE INVENTION

1. Field of the Invention

This invention relates to a thin film transistor (TFT) matrix substrate having TFTs arranged in a matrix pattern, and more particularly to a TFT matrix substrate having a testing circuit for testing the TFT matrix.

2. Description of the Related Art

Generally, a TFT matrix substrate has TFTs formed in a rectangular shape and includes data lines and gate lines. Each data line connects drain electrodes of the TFTs and each gate line connects gate electrodes of the TFTs to each other. Each of the TFTs connected between the gate lines and the data lines responds to a scanning signal from the gate line to switch a data signal to be applied to a pixel cell, such as a liquid crystal cell. The gate lines for applying the scanning signal to the TFTs and the data lines for applying the data signal may get disconnected or break due to a manufacturing tolerance of the TFT matrix substrate, a working error, and so on. If the gate line is broken or disconnected, then the TFTs connected to the gate line can not be driven. On the other hand, if the data line is broken or disconnected, then a data signal is not applied to a part of TFTs. In order to check if the gate line or the data line has a break, the TFT matrix substrate is provided with a testing circuit.

For example, as shown in FIG. 1, a TFT matrix substrate having a testing circuit includes TFTs 14 arranged in each intersection between the gate line 10 and the data line 12. The TFTs 14 apply respectively voltage signals on the data lines 12 to pixel electrodes 14A when a high level voltage is supplied to the gate lines 10. Odd-numbered gate lines of the gate lines 10 are commonly connected to a first test line 16A while the remaining even-numbered gate lines of the gate lines 10 are commonly connected to a second test line 16B. Odd-numbered data lines of the data lines 12 are commonly connected to a third test line 16C while the remaining even-numbered data lines of the data lines 12 are commonly connected to a fourth test line 16D. Each end of the first and second test lines 16A and 16B is provided with gate test pads 18A for receiving a gate test signal. The first and second test lines 16A and 16B apply the gate test signal from the gate test pads 18A to the gate lines 10 when it is intended to test if any gate lines 10 are broken down. Likewise, each end of the third and fourth test lines 16C and 16D is provided with data test pads 18B for receiving a data test signal. The third and fourth test lines 16C and 16D apply the data test signal from the data test pads 18B to the data lines 12 when it is intended to test if any data lines 12 have a break therein.

Further, the TFT matrix substrate includes static electricity preventing circuits or static electricity preventing patterns or devices 20 connected to each of the gate lines 10 and the data lines 12. The static electricity preventing patterns 20 connected to the gate lines 10 are positioned at the opposite sides to the first and second test lines 16A and 16B and, at the same time, commonly connected to a low level gate line 22. The static electricity preventing patterns 20 connected to the data lines 12 are positioned at the opposite sides to the third and fourth test lines 16C and 16D and, at the same time, commonly connected to a common voltage line 24. Such static electricity preventing patterns 20 intercept static electricity to be transferred to the gate lines 10 or the data lines 12, thereby protecting the TFTs 14 from the static electricity.

In the TFT matrix substrate as described above, there occurs a case where the break in the gate line 10 is not detected because of current leaks due to the static electricity preventing circuits or static electricity preventing patterns. More specifically, the static electricity preventing pattern 20 connected to the broken gate line 10 or the broken data line 12 forces a test signal voltage to be charged into the low level gate voltage line 22 or the common voltage line 24, upon testing of the substrate. Then, the voltage charged in the low level gate voltage line 22 or the common voltage line 24 is applied to the broken gate line 10 or the broken data line 12. As a result, the broken gate line 10 or the broken data line 24 can be normally driven. Due to this, the break in the gate line 10 and data lines 12 is not readily detected.

SUMMARY OF THE INVENTION

Accordingly, it is an object of the present invention to provide a TFT matrix substrate having a testing circuit that is capable of accurately detecting the breaking down of gate lines and data lines.

A further object of the present invention to provide a testing method of a TFT matrix substrate that can accurately detect the breaking down of gate lines and data lines.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a thin film transistor matrix substrate according to an aspect of the present invention includes thin film transistors connected to gate lines and data lines at the intersection of the gate lines and the data lines, static electricity preventing means installed at each of the gate lines and the data lines, a first shorting bar connected to the gate lines commonly, a second shorting bar connected to the data lines commonly, a first test pad for receiving a first test signal to be applied to the first shorting bar, a second test pad for receiving a first test signal to be applied to the second shorting bar, a third shorting bar commonly connected to static electricity preventing means installed at the gate lines in the static electricity preventing means, a fourth shorting bar commonly connected to static electricity preventing means installed at the data lines in the static electricity preventing means, and charge preventing means for preventing a voltage from being charged into the third and fourth shorting bars when testing if the gate lines and the data lines has been broken down.

A thin film transistor matrix substrate according to another aspect of the present invention includes thin film transistors connected to gate lines and data lines forming a matrix, a first shorting bar connected to the gate lines, a second shorting bar connected to the data lines, a first test pad connected to the first shorting bar and responsive to a first test signal, a second test pad connected to the second shorting bar and responsive to the first test signal, a first set of discharge circuits connected to the gate lines, a second set of discharge circuits connected to the data lines, a third shorting bar connected to the first set of discharge circuits coupled to the gate lines, a fourth shorting bar connected to the second set of discharge circuits coupled to the data lines, and a jumper connected between the first and third shorting bars.

A testing method of the thin film transistor matrix substrate having thin film transistors connected to gate lines and data lines at the intersection of the gate lines and the data lines, static electricity preventing means installed at each of the gate lines and the data lines, a first shorting bar commonly connected to the gate lines, a second shorting bar commonly connected to the data lines, and a third shorting bar commonly connected to static electricity preventing means installed to the gate lines in the static electricity preventing means, includes the steps of applying a first test signal to the first and second shorting bars, and applying a second test signal to the third shorting bar.

Another testing method of the thin film transistor matrix substrate having thin film transistors connected to gate lines and data lines at the intersection of the gate lines and the data lines, static electricity preventing means installed at each of the gate lines and the data lines, a first shorting bar commonly connected to the gate lines, a second shorting bar commonly connected to the data lines, and a third shorting bar commonly connected to static electricity preventing means installed to the data lines in the static electricity preventing means, includes the steps of applying a first test signal to the first and third shorting bars, and applying a second test signal to the second shorting bar.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Figure 1:
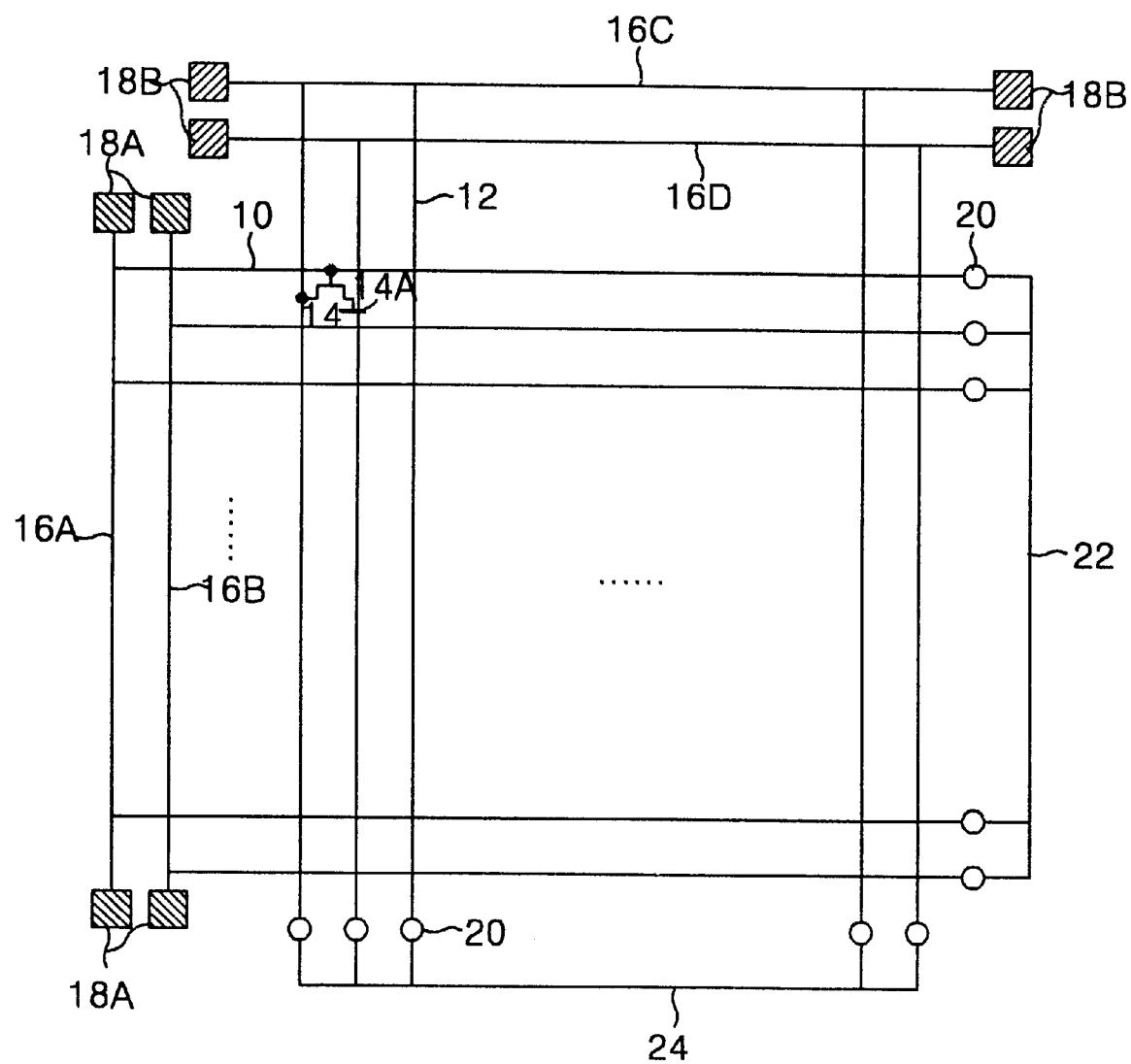
FIG. 1 is a schematic view showing a TFT matrix substrate having a conventional testing circuit.
Figure 2:
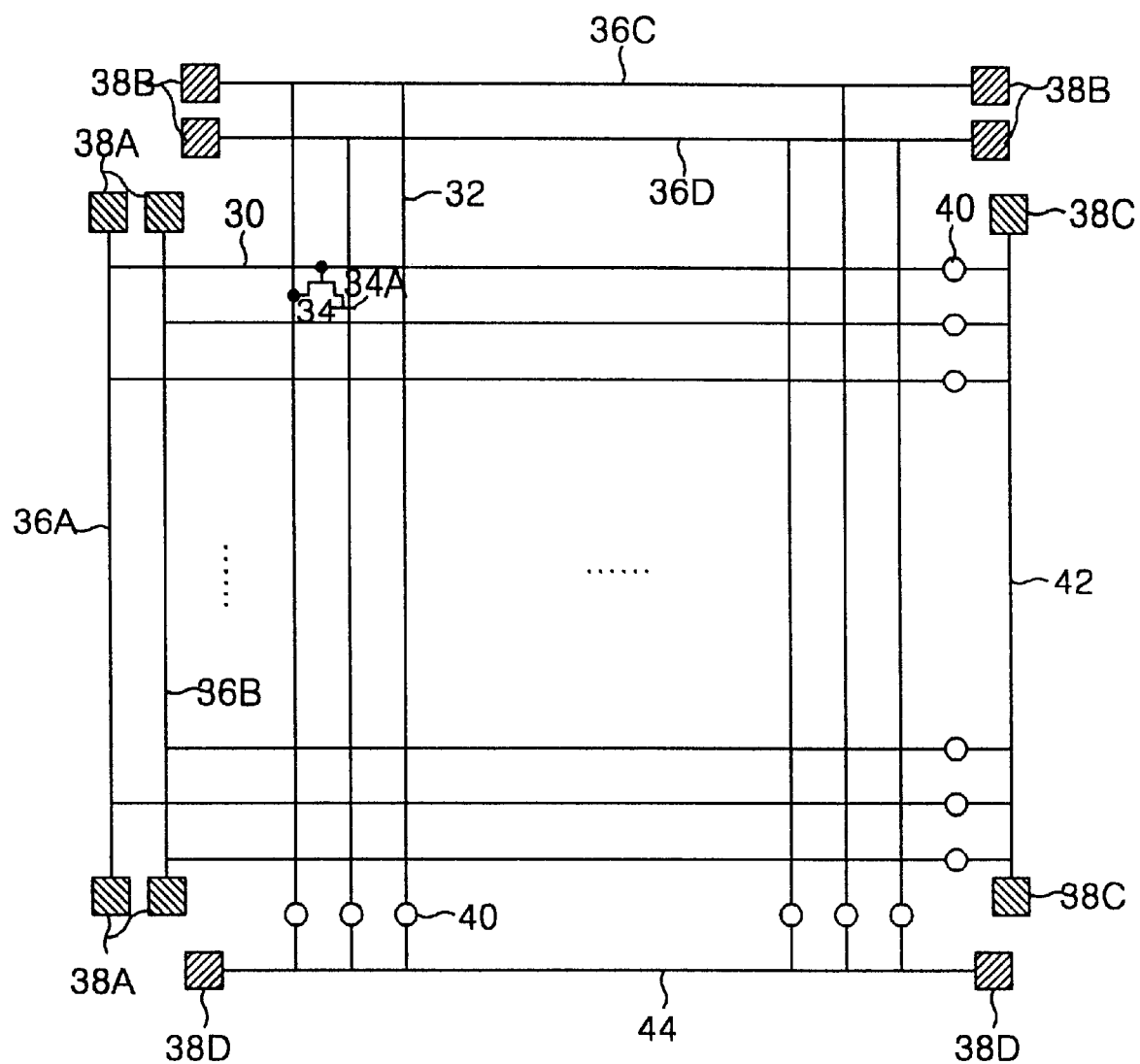
FIG. 2 is a schematic view showing a TFT matrix substrate having a testing circuit according to an embodiment of the present invention.

Referring to FIG. 2, there is shown a TFT matrix substrate having a testing circuit according to an embodiment of the present invention. The TFT matrix substrate includes TFTs 34 arranged in each intersection between a gate line 30 and a data line 32. The TFTs 34 apply respectively voltage signals on the data lines 32 to pixel electrodes 34A when a high level voltage is supplied to the gate lines 30. Odd-numbered gate lines of the gate lines 30 are commonly connected to a first test line 36A while the remaining even-numbered gate lines of the gate lines 30 are commonly connected to a second test line 36B. Odd-numbered data lines of the data lines 32 are commonly connected to a third test line 36C while the remaining even-numbered data lines of the data lines 32 are commonly connected to a fourth test line 36D. Each end of the first and second test lines 36A and 36B are provided with gate test pads 38A for receiving a gate test signal. The first and second test lines 36A and 36B apply the gate test signal from the gate test pads 38A to the gate lines 30 when it is intended to test if any gate lines 30 are broken or disconnected. Likewise, each end of the third and fourth test lines 36C and 36D are provided with data test pads 38B for receiving a data test signal. The third and fourth test lines 36C and 36D apply the data test signal from the data test pads 38B to the data lines 32 when it is intended to test if any data lines 32 are broken or disconnected.

The TFT matrix substrate further includes static electricity preventing patterns 40 (or static electricity preventing circuits) connected to each of the gate lines 30 and the data lines 32. The static electricity preventing patterns 40 connected to the gate lines 30 are positioned at the opposite sides to the first and second test lines 36A and 36B and, at the same time, commonly connected to a low level gate line 42. The static electricity preventing patterns 40 connected to the data lines 32 are positioned at the opposite sides to the third and fourth test lines 36C and 36D and, at the same time, commonly connected to a common voltage line 44. Such static electricity preventing patterns 40 intercept and draws static electricity in the gate lines 30 or the data lines 32, thereby protecting the TFTs 34 from the static electricity.

Each end of the low level gate voltage line 42 is provided with third test pads 38C. These third test pads 38 connect the low level gate voltage line 42 to a ground voltage source (not shown), thereby preventing a test signal voltage from being charged into or remain in the low level gate voltage line 42. In other words, a test signal applied to the gate lines 30 is not leaked. As a result, the break in the gate lines 30 is accurately detected.

Also, each end of the common voltage line 44 is provided with fourth test pads 38D. These fourth test pads 38D connect the common voltage line to the ground voltage source, thereby preventing a test signal voltage from being charged into or remain in the common voltage line 44. In other words, a test signal applied to the data lines 30 is not leaked. As a result, the breaking down of the data lines 32 is accurately detected.

In order to test the data lines on the TFT matrix substrate shown in FIG. 2, a first high level voltage of about 20V is applied to the first and second test lines 36A and 36B through the first test pads 38A and a second high level voltage of about 10V is supplied to the third and fourth test lines 36C and 36D through the second test pads 38B. Also, the low level gate voltage line 42 and the common voltage line 44 are commonly connected to the ground voltage source each through the third and fourth test pads 38C and 38D. Then, the pixel, i.e., TFT 34 positioned at each intersection of the gate line 30 and data line 32, is driven. To this end, in each the pixel electrode 34A connected to the TFT 34 which is driven, there appears an electric field.

Figure 3:
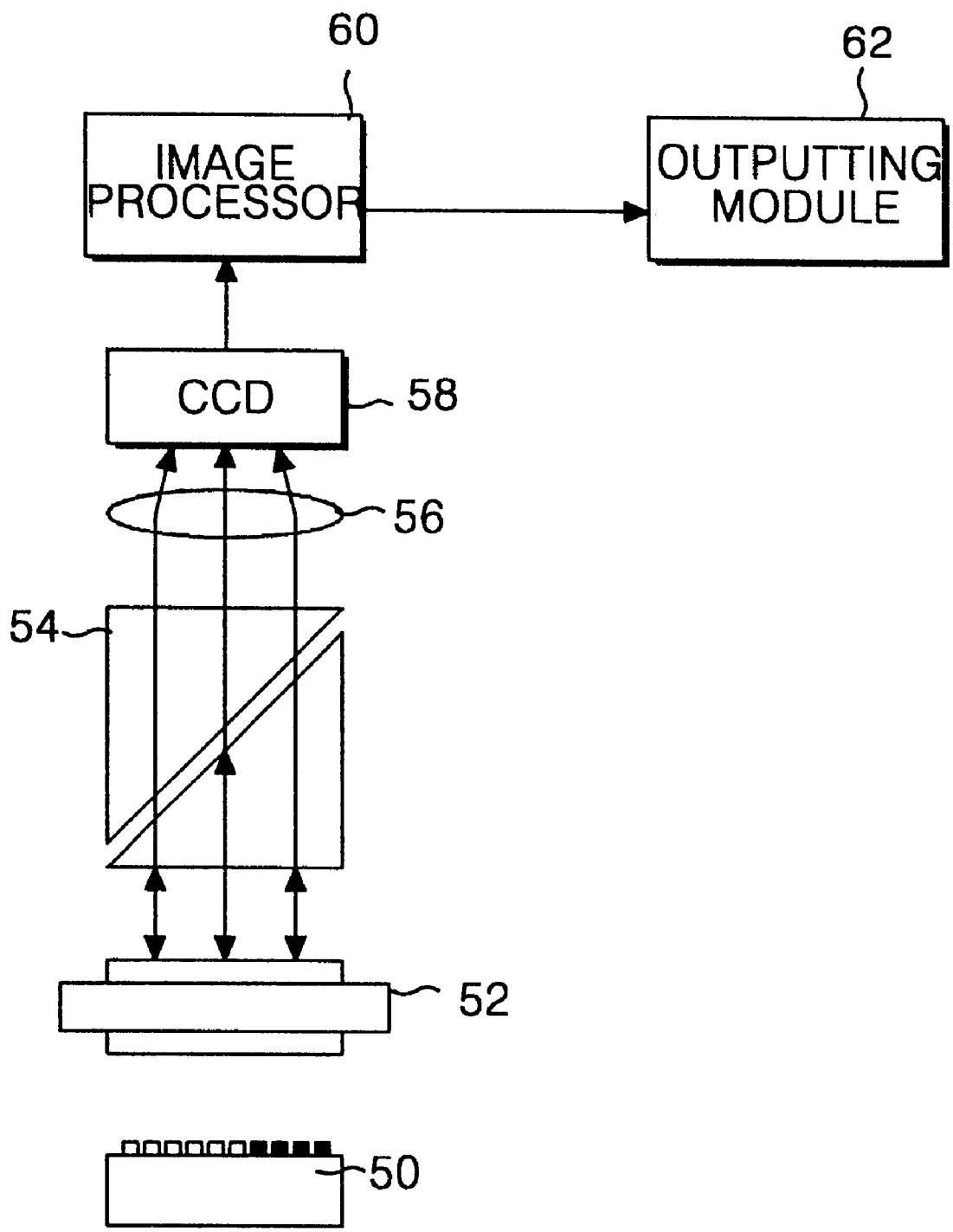
FIG. 3 shows a TFT substrate testing apparatus for a TFT matrix substrate.
Figure 4A:
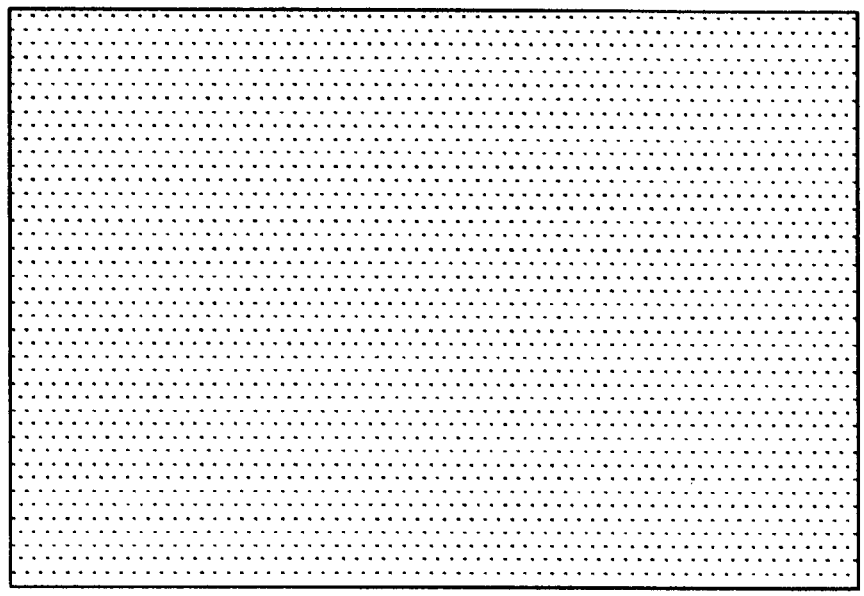
FIG. 4A represents a testing resultant of a TFT matrix substrate having a conventional testing circuit.
Figure 4B:
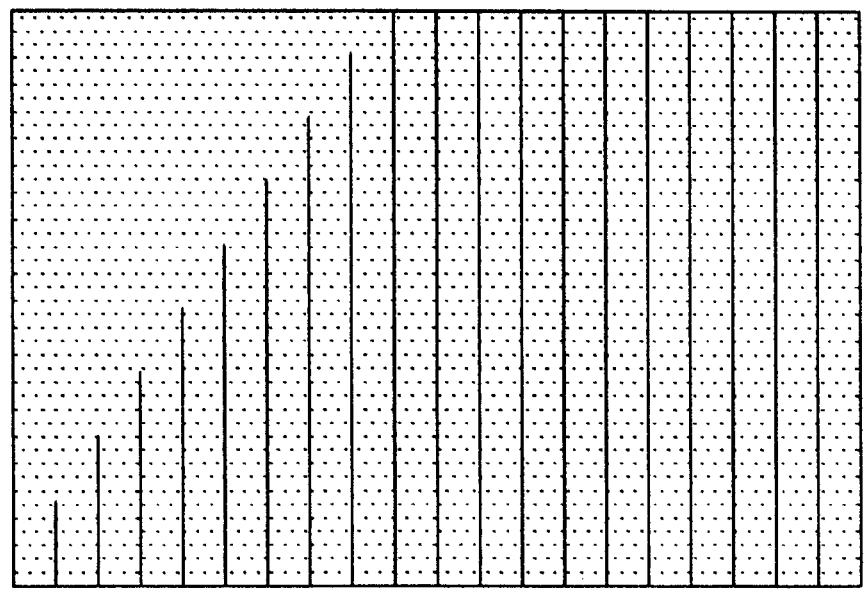
FIG. 4B explains a test resultant of a TFT matrix substrate having a testing circuit according to an embodiment of the present invention.

The electric field in each the pixel electrode 34A is detected by a TFT substrate testing apparatus as shown in FIG. 3. The testing apparatus of FIG. 3 includes a modulator 52, a signal converter 54, a lens 56, a charge coupled device 58 and an image processor 60 arranged between a TFT matrix substrate 50 and an outputting module 62 in serial. The modulator 52 detects an electric field signal from the TFT matrix substrate 50 and applies the detected electric field signal to the signal converter 54. The signal converter 54 converts the detected electric field signal into a light signal. The light signal is applied to the charge coupled device 58 through the lens 56. The lens 56 converges the light signal from the signal converter 54 on the charge coupled device 58. The charge coupled device 58 converts the light signal from the lens 56 into a electric signal to be applied to the image processor 60. The image processor 60 processes the electric signal a testing signal, resulting in a test having the shape of a graphic picture such as FIGS. 4A and 4B. The resultant test generated in the image processor 60 is displayed on a screen by the outputting module 62. The resultant test is optionally printed on a printing paper by the outputting module 62. The TFT substrate testing apparatus provides a test, resulting in a graphic picture such as FIGS. 4A and 4B. FIG. 4A shows a testing result of the prior TFT matrix substrate, while FIG. 4B represents a testing result of the TFT matrix substrate used in the present invention shown in FIG. 2. In FIG. 4A, data lines 32 have breaks but appear as if the data lines are in a normal operation. Whereas, in FIG. 4B, each data line 32 has a break and is shown in a solid line, allowing the break in the data line 32 to be detected accurately.

On the other hand, the TFTs on the TFT matrix substrate can be test in division or in selected groups. In other words, the gate and data lines on the TFT matrix substrate are tested divisibly, thereby detecting the break in the data line 32 between the gate lines and the break in the gate line 30 between the data lines 32. In the divisional testing method, the second high level voltage is sequentially applied to the third and fourth test lines 36C and 36D, while the first high level voltage is respectively supplied to the first and second test lines 36A and 36B.

Figure 5:
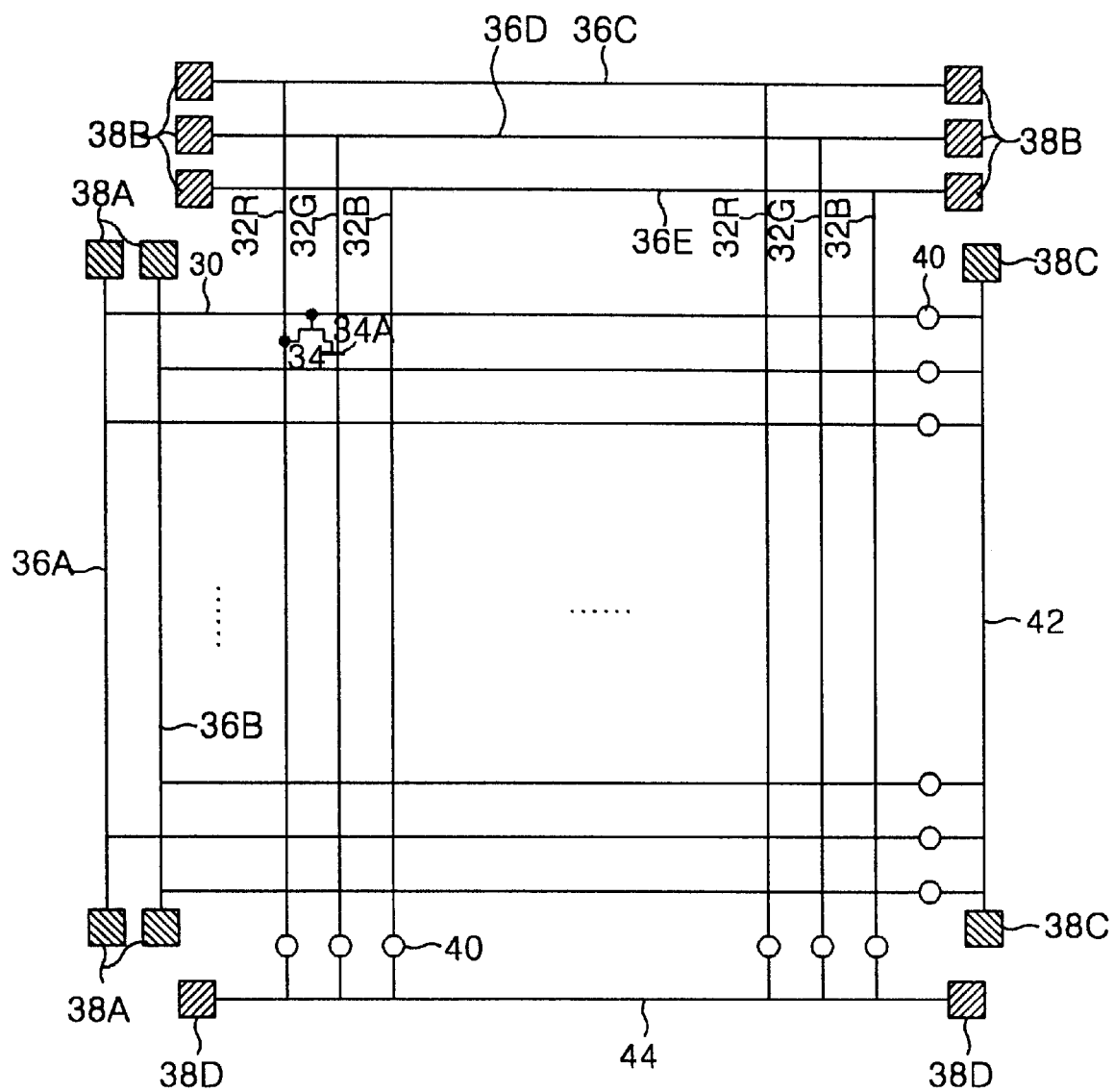
FIG. 5 is a schematic view showing a TFT matrix substrate having a testing circuit according to another embodiment of the present invention.

Referring now to FIG. 5, there is shown a TFT matrix substrate having a testing circuit according to another embodiment of the present invention. The TFT matrix substrate includes TFTs 34 arranged in each intersection between a gate line 30 and a data line 32. The TFTs 34 apply respectively voltage signals on the data lines 32 to pixel electrodes 34A when a high level voltage is supplied to the gate lines 30. Odd-numbered gate lines of the gate lines 30 are commonly connected to a first test line 36A while the remaining even-numbered gate lines of the gate lines 30 are commonly connected to a second test line 36B. Red data lines 32R of the data lines 32 are commonly connected to a third test line 36C, green data lines 32G thereof are commonly connected to a fourth test line 36D, and blue data lines 32B thereof are commonly connected to a fifth test line 36E.

Each end of the first and second test lines 36A and 36B are provided with first test pads 38A for receiving a gate test signal. The first and second test lines 36A and 36B apply the gate test signal from the first test pads 38A to the gate lines 30 when it is intended to test if any gate lines 30 are broken down. Likewise, each end of the third to fifth test lines 36C to 36E are provided with second test pads 38B for receiving a data test signal. The third to fifth test lines 36C to 36E apply the data test signal from the second test pads 38B to the data lines 32 when it is intended to test if any data lines 32 are broken down.

The TFT matrix substrate further includes static electricity preventing patterns 40 (or static electricity preventing circuits) connected to each of the gate lines 30 and the data lines 32. The static electricity preventing patterns 40 connected to the gate lines 30 are positioned at the opposite sides to the first and second test lines 36A and 36B and, at the same time, commonly connected to a low level gate line 42. The static electricity preventing patterns 40 connected to the data lines 32 are positioned at the opposite sides to the third, fourth and fifth test lines 36C and 36D and, at the same time, commonly connected to a common voltage line 44. Such static electricity preventing patterns 40 intercept a static electricity to be transferred to the gate lines 30 or the data lines 32, thereby protecting the TFTs 34 from the static electricity.

Each end of the low level gate voltage line 42 is provided with third test pads 38C. These third test pads 38 connect the low level gate voltage line 42 to a ground voltage source (not shown), thereby preventing a test signal voltage from being charged into or remain in the low level gate voltage line 42. In other words, a test signal applied to the gate lines 30 is not leaked. As a result, the break in the gate lines 30 is accurately detected.

Also, each end of the common voltage line 44 is provided with fourth test pads 38D. These fourth test pads 38D connect the common voltage line to the ground voltage source, thereby preventing a test signal voltage from being charged into or remain in the common voltage line 44. In other words, a test signal applied to the data lines 30 is not leaked. As a result, the break in the data lines 32 is accurately detected.

In the test of the data lines 32 on the TFT matrix substrate shown in FIG. 5, a first high level voltage of about 20V is applied to the first and second test lines 36A and 36B through the first test pads 38A and a second high level voltage of about 10V is supplied to the third to fifth test lines 36C to 36E through the second test pads 38B. Also, the low level gate voltage line 42 and the common voltage line 44 are commonly connected to the ground voltage source, each through the third and fourth test pads 38C and 38D. Then, the pixel, i.e., TFT 34 positioned at each intersection of the gate line 30 and data line 32, is driven. To this end, in each the pixel electrode 34A connected to the TFT 34 which is driven, there appears an electric field. The electric field in each the TFT is detected by a TFT substrate testing apparatus as shown in FIG. 3. The TFT substrate testing apparatus provides a testing result in a graphic picture such as FIGS. 4A and 4B. FIG. 4A shows a testing result of the prior TFT matrix substrate, while FIG. 4B represents a testing result of the TFT matrix substrate shown in FIG. 5. In FIG. 4A, each data lines 32 has a break and is shown in a real or solid line, allowing the breaking of the data line to be detected accurately.

On the other hand, the TFTs on the TFT matrix substrate can be test in division. In this case, the breaking of the data line 32 between the gate lines and the breaking of the gate line 30 between the data lines 32 become detected because each of the gate and data lines on the TFT matrix substrate is divided. In the divisional testing method, the second high level voltage is sequentially applied to the third, fourth and fifth test lines 36C, 36D and 36E each, while the first high level voltage is respectively supplied to the first and second test lines 36A and 36B.

Figure 6:
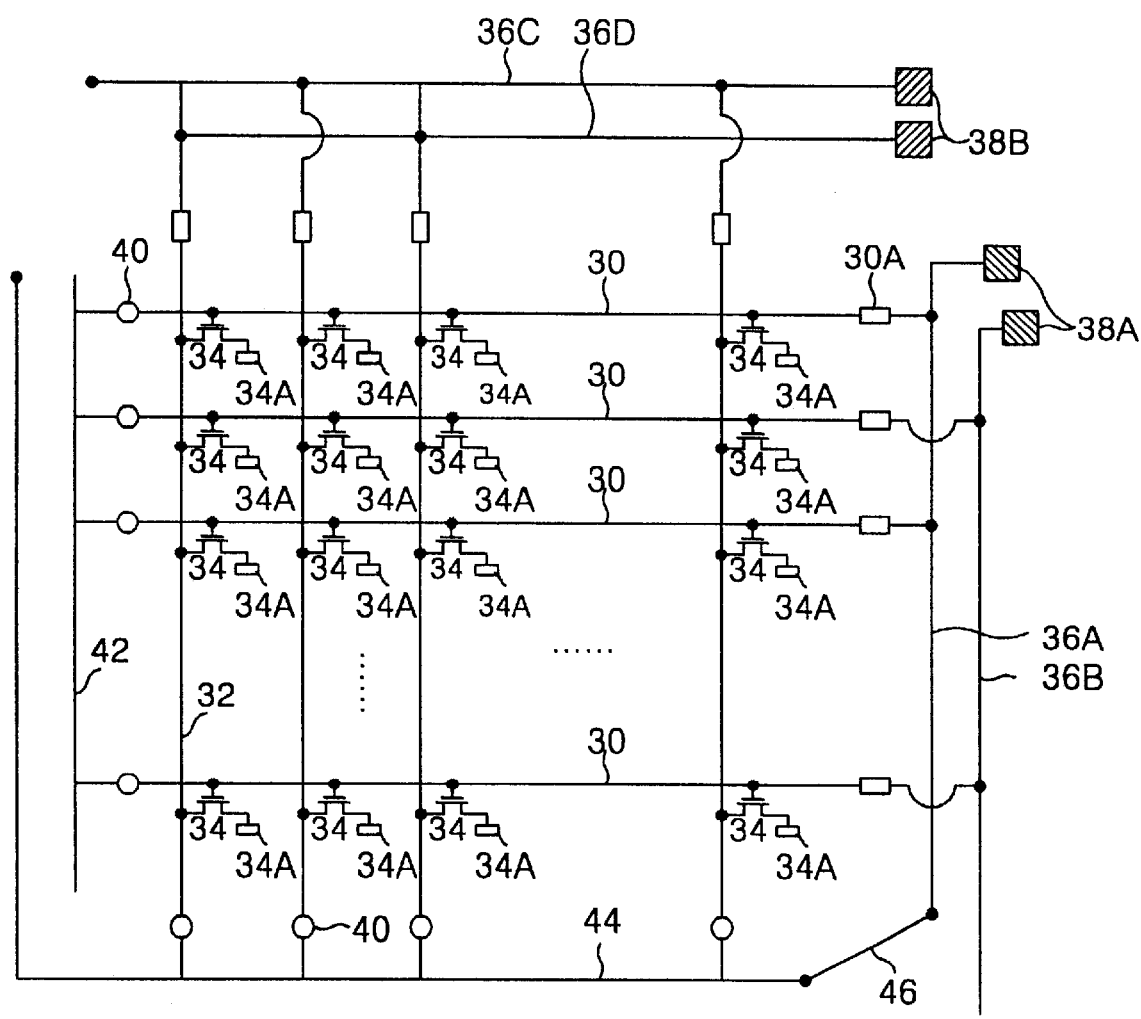
FIG. 6 is a schematic view showing a TFT matrix substrate having a testing circuit according to still another embodiment of the present invention.

FIG. 6 shows a TFT matrix substrate having a testing circuit according to still another embodiment of the present invention. The TFT matrix substrate includes a plurality of gate and data lines 30 and 32 forming a matrix, TFTs 34 arranged in each intersection between the gate line 30 and a data line 32, and pixel electrodes 34A connected respectively to output terminals of the TFTs 34. The TFTs 34 apply respectively voltage signals on the data lines 32 to pixel electrodes 34A when a high level voltage is supplied to the gate lines 30. The pixel electrode 34A is formed on area defined by the gate line 30 and the data line 32. The gate lines 30 have gate pads 30A formed at one end thereof, respectively. Odd-numbered gate pads of the gate pads 30A are commonly connected to a first test line 36A (or a first dummy material bar 36A) while the remaining even-numbered gate pads of the gate pads 30A are commonly connected to a second test line 36B (or a second dummy material bar 36B). Also, the data lines 32 have data pads 32A formed at one end thereof, respectively. Odd-numbered data pads of the data pads 32A are commonly connected to a third test line 36C (a third dummy material bar 36C) while the remaining even-numbered data pads of the data pads 32A are commonly connected to a fourth test line 36D (a fourth dummy material bar 36D). One end of the first and second test lines 36A and 36B are provided with gate test pad 38A for receiving a gate test signal. The first and second test lines 36A and 36B apply the gate test signal from the gate test pads 38A to the gate lines 30 when it is intended to test if any gate lines 30 are broken or disconnected. Likewise, one end of the third and fourth test lines 36C and 36D are provided with data test pad 38B for receiving a data test signal. The third and fourth test lines 36C and 36D apply the data test signal from the data test pads 38B to the data lines 32 when it is intended to test if any data lines 32 are broken or disconnected.

The TFT matrix substrate further includes static electricity preventing patterns 40 (or static electricity preventing circuits) connected to each of the gate lines 30 and the data lines 32. The static electricity preventing patterns 40 connected to the gate lines 30 are positioned at the opposite sides to the first and second test lines 36A and 36B and, at the same time, commonly connected to a low level gate line 42 (or a dummy material bar 42). The static electricity preventing patterns 40 connected to the data lines 32 are positioned at the opposite sides to the third and fourth test lines 36C and 36D and, at the same time, commonly connected to a common voltage line 44. Such static electricity preventing patterns 40 intercept and draws static electricity in the gate lines 30 or the data lines 32, thereby protecting the TFTs 34 from the static electricity. To this end, the static electricity preventing pattern 40 has a resistance of 10 MΩ.

Figure 7:
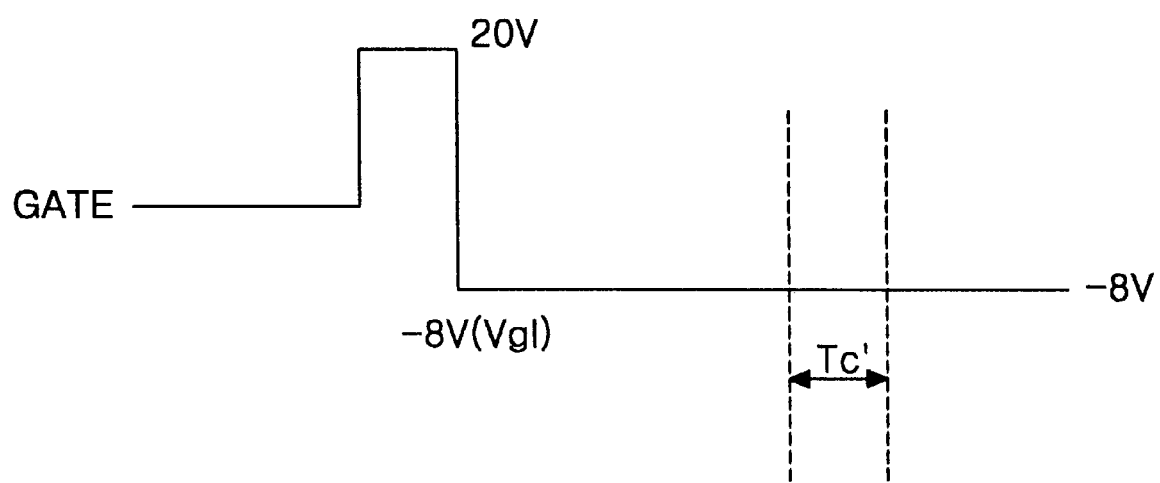
FIG. 7 is a waveform of a test signal to be applied to the gate lines shown in FIG. 6.

The common voltage line 44 is connected to the first test line 36A through a jumper 46. The jumper 46 can connect the common voltage line 44 with the second test line 36B instead of the first test line 36A. The jumper 46 applies a voltage signal of low level voltage (for example, −8V) from the first test line 36A (or the second test line 36B) to the common voltage line 44, thereby preventing a test signal voltage from being charged into or remain in the common voltage line 44. In other words, a test signal applied to the data lines 32 is not leaked. As a result, the breaking down of the data lines 32 is accurately detected. To this end, the voltage signal has the low level voltage after maintaining a high level voltage (for example, 20V) during a constant period, as shown in FIG. 7.

In order to test the data lines 32 on the TFT matrix substrate shown in FIG. 6, the TFT matrix substrate is disposed below the modulator 52 included in the TFT substrate testing apparatus as shown in FIG. 3. Then, a first test signal as shown in FIG. 7 is applied to the first and second test lines 36A and 36B through the first test pads 38A and a second test signal of high level voltage (for example, 10V) is supplied to the third and fourth test lines 36C and 36D through the second test pads 38B. The pixel, i.e., TFT 34 positioned at each intersection of the gate line 30 and data line 32, is charged electric charges when the first test signal applied to the first and second test lines 36A and 36B have a high level voltage of 20V. To this end, in each the pixel electrode 34A connected to the TFT 34 which is driven, electric charges are charged. When the first test signal on the first and second test lines 36A and 36B maintains a low level voltage of −8V, the common voltage line 44 receives the low level voltage from the first test line 36A via the jumper 46 so that the second test signal voltage is not charged into or does not remain in the common voltage line 44. In other words, the second test signal applied to the data lines 32 is not leaked. As a result, the breaking down of the data lines 32 is accurately detected by a TFT substrate testing apparatus as shown in FIG. 3. The TFT substrate testing apparatus detects the breaking down of the data line during period of Tc as shown in FIG. 7. The resultant test detected by the testing apparatus is displayed on a screen by the outputting module 62. After the test of the TFT matrix substrate, the first to fourth test lines 36A to 36D and the jumper 46 are removed by cutting the TFT matrix substrate along with a dot line C–C', such that the gate pads 30A and the data pads 32A are separated from the test lines 36A to 36D.

As described above, in the TFT matrix substrate having the testing circuit according to the present invention, a ground voltage is applied to the low level gate voltage line and the common voltage line by means of the third and fourth test pads, thereby preventing leakage of the test signal voltage. Accordingly, the broken gate lines and the broken data lines are not driven during testing thereof As a result, the break in gate lines and data lines can be accurately detected. Also, in the TFT matrix substrate having the testing circuit according to the present invention, a test signal having in sequence the high and low level voltages is simultaneously applied the common voltage line and the gate lines, thereby preventing leakage of the test signal voltage applied to the data lines. Accordingly, the broken gate lines and the broken data lines are not driven during testing thereof As a result, the break in gate lines and data lines can be accurately detected.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor matrix substrate having thin film transistors connected to gate lines and data lines forming a matrix, the thin film transistor matrix substrate comprising:
   a first shorting bar connected to the gate lines;
   a second shorting bar connected to the data lines;
   a first test pad connected to the first shorting bar and responsive to a first test signal;
   a second test pad connected to the second shorting bar and responsive to the first test signal;
   a first set of discharge circuits connected to the gate lines;
   a second set of discharge circuits connected to the data lines;
   a third shorting bar connected to the first set of discharge circuits coupled to the gate lines;

a fourth shorting bar connected to the second set of discharge circuits coupled to the data lines; and charge preventing means for preventing a voltage from being charged into the third and fourth shorting bars while testing the gate lines and the data lines for breaks.

2. The thin film transistor matrix substrate of claim 1, wherein the charge preventing means includes:

a third test pad connected to the third shorting bar for receiving a second test signal; and a fourth test pad connected to the fourth shorting bar for receiving the second test signal.

3. The thin film transistor matrix substrate as claimed in claim 2, wherein the second test signal is ground.

4. A thin film transistor matrix substrate having thin film transistors connected to gate lines and data lines forming a matrix, the thin film transistor matrix substrate comprising:

a first gate shorting bar connected to a first end of the gate lines;

a first gate test pad connected to the first gate shorting bar and responsive to a first test signal;

a first set of discharge circuits connected to a second end of the gate lines;

a second gate shorting bar connected to the first set of discharge circuits coupled to the second end of the gate lines; and a second gate test pad connected to the second gate shorting bar and responsive to a second test signal.

5. The thin film transistor matrix substrate of claim 4, wherein the first test signal is a positive voltage and the second test signal is a ground voltage.

6. The thin film transistor matrix substrate of claim 4, further comprising:

a first data shorting bar connected to a first end of the data lines;

a first data test pad connected to the first data shorting bar and responsive to a third test signal;

a second set of discharge circuits connected to a second end of the data lines; and a second data shorting bar connected to the second set of discharge circuits coupled to the second end of the data lines.

7. The thin film transistor matrix substrate of claim 6, further comprising a second data test pad connected to the second data shorting bar and responsive to the second test signal.

8. The thin film transistor matrix substrate of claim 7, wherein the first and third test signals are positive voltages and the second test signal is a ground voltage.

9. The thin film transistor matrix substrate of claim 6, wherein the first data shorting bar includes at least three shorting bars, a first bar being connected to data lines representing red pixels, a second bar being connected to data lines representing green pixels and a third bar being connected to data lines representing red pixels.

10. The thin film transistor matrix substrate of claim 9, further comprising a second data test pad connected to the second data shorting bar and responsive to the second test signal.

11. The thin film transistor matrix substrate of claim 10, wherein the first and third test signals are positive voltages and the second test signal is a ground voltage.

12. A method of testing a substrate having thin film transistors connected to gate lines and data lines forming a matrix, static electricity preventing means installed at each of the gate lines and the data lines, a first shorting bar connected to the gate lines, a second shorting bar connected to the data lines, and a third shorting bar connected to static electricity preventing means installed to the gate lines in the static electricity preventing means, said method comprising the steps of:

applying a first test signal to the first and second shorting bars; and applying a second test signal to the third shorting bar.

13. The method of claim 12, wherein the second test signal is a ground voltage.

14. A method of testing a thin film transistor matrix substrate having thin film transistors connected to gate lines and data lines forming a matrix, comprising the steps of:

forming a first gate shorting bar connected to a first end of the gate lines;

forming a first gate test pad connected to the first gate shorting bar and responsive to a first test signal;

forming a first set of discharge circuits connected to a second end of the gate lines;

forming a second gate shorting bar connected to the first set of discharge circuits coupled to the second end of the gate lines;

forming a second gate test pad connected to the second gate shorting bar and responsive to a second test signal; and providing a positive voltage as the first test signal and a ground voltage as the second test signal.

15. The method of claim 14, further comprising the steps of:

forming a first data shorting bar connected to a first end of the data lines;

forming a first data test pad connected to the first data shorting bar and responsive to a third test signal;

forming a second set of discharge circuits connected to a second end of the data lines; and forming a second data shorting bar connected to the second set of discharge circuits coupled to the second end of the data lines.

16. The method of claim 15, further comprising the step of forming a second data test pad connected to the second data shorting bar and responsive to the second test signal.

17. The method of claim 16, further comprising the step of providing the positive voltage as the third test signal.

18. The method of claim 14, wherein the first data shorting bar includes at least three shorting bars, a first bar being connected to data lines representing red pixels, a second bar being connected to data lines representing green pixels and a third bar being connected to data lines representing blue pixels.

19. The method of claim 18, further comprising a second data test pad connected to the second data shorting bar and responsive to the second test signal.

20. The method of claim 19, further comprising the step of providing the positive voltage as the third test signal.

21. A thin film transistor matrix substrate having thin film transistors connected to gate lines and data lines forming a matrix, the thin film transistor matrix substrate comprising:

a first shorting bar connected to the gate lines;

a second shorting bar connected to the data lines;

a first test pad connected to the first shorting bar and responsive to a first test signal;

a second test pad connected to the second shorting bar and responsive to the first test signal;

a first set of discharge circuits connected to the gate lines;

a second set of discharge circuits connected to the data lines;

a third shorting bar connected to the first set of discharge circuits coupled to the gate lines;

a fourth shorting bar connected to the second set of discharge circuits coupled to the data lines; and a jumper connected between the first and third shorting bars.

22. The thin film transistor matrix substrate of claim 21, wherein the first test signal has in sequence a first high level voltage and a low level voltage and the second test signal maintains a second high level voltage.

23. A testing method of the thin film transistor matrix substrate having thin film transistors connected to gate lines and data lines at the intersection of the gate lines and the data lines, static electricity preventing means installed at each of the gate lines and the data lines, a first shorting bar commonly connected to the gate lines, a second shorting bar commonly connected to the data lines, and a third shorting bar commonly connected to static electricity preventing means installed to the data lines in the static electricity preventing means, the method comprising the steps of:

applying a first test signal to the first and third shorting bars; and applying a second test signal to the second shorting bar.

* * * * *